(12) United States Patent
Stephens et al.

(10) Patent No.: US 9,436,081 B2
(45) Date of Patent: Sep. 6, 2016

(54) METHODS OF MODIFYING MASKING RETICLES TO REMOVE FORBIDDEN PITCH REGIONS THEREOF

(71) Applicant: GLOBALFOUNDRIES Inc., Grand Cayman (KY)

(72) Inventors: Jason Eugene Stephens, Albany, NY (US); David Pritchard, Glenville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 261 days.

(21) Appl. No.: 14/205,569

(22) Filed: Mar. 12, 2014

(65) Prior Publication Data

US 2015/0261084 A1 Sep. 17, 2015

(51) Int. Cl.
*G03F 1/72* (2012.01)

(52) U.S. Cl.
CPC ...................... *G03F 1/72* (2013.01)

(58) Field of Classification Search
CPC ........................................ G03F 1/72
See application file for complete search history.

(56) References Cited

U.S. PATENT DOCUMENTS 6,973,636 B2   12/2005   Shin et al.

2004/0219435 A1*  11/2004  Wu .................... G03F 1/36
                                              430/5
2007/0028200 A1    2/2007  Blatchford et al.
2007/0031737 A1*   2/2007  Schroeder ........... G03F 1/144
                                              430/5

OTHER PUBLICATIONS

Shyng-Tsong Chen et al., "Oslo-1 M2/M3 Levels SIT Integration Process Flow", PreTO Alliance, 36 pages, Nov. 20, 2012.
Xuelong Shi et al., "Understanding the Forbidden Pitch and Assist Feature Placement", 21st Annual BACUS Symposium on Photomask Technology, Proceedings of SPIE vol. 4562, pp. 968-979 (2002).
Ching-Heng Wang et al., "No-Forbidden-Pitch SRAF Rules for Advanced Contact Lithography", Mentor Graphics 6 pages (2006).

* cited by examiner

*Primary Examiner* — Stephen Rosasco
(74) *Attorney, Agent, or Firm* — Heslin Rothenberg Farley & Mesiti P.C.

(57) ABSTRACT

A method is provided, in which a masking reticle including a plurality of pattern blocks is modified, the modifying including: identifying a first pattern block and a second pattern block of the plurality of pattern blocks where at least a first portion of the first pattern block and a second portion of the second pattern block are in parallel relation; and reducing a length of the first portion of the first pattern block when a transverse separation S between corresponding length edges of the first portion of the first pattern block second portion of the second pattern block falls within a pre-defined forbidden pitch range for the masking reticle. The method may include repeating the identifying and reducing of pairs of pattern blocks on the mask reticle to remove portions of pattern block pairs spaced apart by a transverse separation falling within a forbidden-pitch range.

20 Claims, 14 Drawing Sheets

METHODS OF MODIFYING MASKING RETICLES TO REMOVE FORBIDDEN PITCH REGIONS THEREOF

FIELD OF THE INVENTION

The present invention generally relates to masking reticles for lithography, and more specifically to methods of modifying mask patterns on masking reticles by removing portions of mask blocks whose separation from nearby mask block portions falls within a pre-determined forbidden pitch range for the masking reticle.

BACKGROUND

As the dimensions of features of semiconductor devices continue to be reduced, lithographic techniques and tools may need to be modified to accurately form functioning integrated circuit devices. Reticle masks may need to be modified from their intended design in order to avoid issues associated with forming features on a wafer that are smaller than the wavelength of photolithographic light being used to form those features, such as light diffraction and constructive or destructive interference of light. In some cases, new lithographic techniques, such as double-patterning, may help in overcoming some limitations of older techniques, but often pose new problems and challenges. There is thus a continuing need for improved methods of lithography, and particularly for improved methods of double-patterning lithography.

SUMMARY OF THE INVENTION

The shortcomings of the prior art are overcome and additional advantages are provided through the provision, in one aspect, of a method including: obtaining a masking reticle including a mask pattern, the mask pattern including a plurality of pattern blocks, the pattern blocks oriented in a direction of a length axis; modifying the mask pattern to obtain a modified mask pattern by: identifying a first pattern block and a second pattern block of the plurality of pattern blocks where at least a first portion of the first pattern block and a second portion of the second pattern block are in parallel relation in the direction of the length axis; and, reducing a length of the first portion of the first pattern block by a length L1 when a transverse separation S between a length edge of the first portion of the first pattern block and a corresponding length edge of the second portion of the second pattern block falls within a pre-defined forbidden pitch range for the masking reticle.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
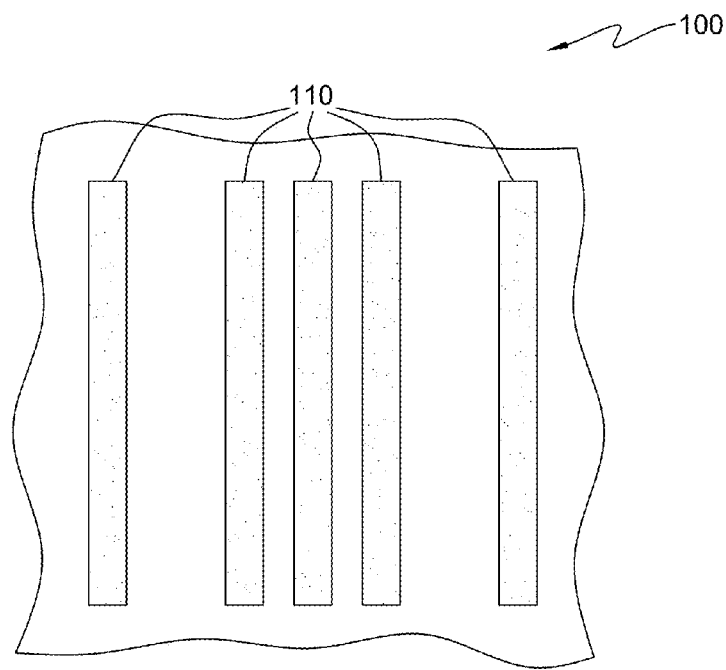
FIGS. 1A-1D illustrate an embodiment of a double-patterning process using a masking reticle, according to one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Generally stated, provided herein, in one aspect, is a method, the method including: obtaining a masking reticle comprising a mask pattern, the mask pattern including a plurality of pattern blocks, the pattern blocks oriented in a direction of a length axis; modifying the mask pattern to obtain a modified mask pattern by: identifying a first pattern block and a second pattern block of the plurality of pattern blocks where at least a first portion of the first pattern block and a second portion of the second pattern block are in parallel relation in the direction of the length axis; and, reducing a length of the first portion of the first pattern block by a length L1 when a transverse separation S between a length edge of the first portion of the first pattern block and a corresponding length edge of the second portion of the second pattern block falls within a pre-defined forbidden pitch range for the masking reticle. In one or more embodiments, the reducing may result in the first pattern block and the second pattern block no longer having first and second portions thereof in parallel relation in the direction of the length axis.

In additional embodiments, modifying the mask pattern may include repeating the identifying and reducing for multiple pairs of pattern blocks of the plurality of pattern blocks. In at least one example, the resulting modified mask pattern has no pair of pattern blocks, of the plurality of pattern blocks, with a transverse separation S between a length edge of one pattern block and a corresponding length edge of another pattern block falling within the pre-defined forbidden pitch range for the masking reticle.

In further embodiments, the modified mask pattern may also modify a design of a circuit structure layer. In one or more examples, the modified mask pattern may be applied to a lithographic process. The lithographic process may, in at least one instance, include overlaying the masking reticle with the modified mask pattern with a circuit structure design reticle.

Reference is made below to the drawings, which are not drawn to scale for ease of understanding, wherein the same reference numbers used throughout different figures designate the same or similar components.

FIG. 1A depicts an embodiment of a design 100 of a circuit structure layer. Design 100, in this exemplary embodiment, includes a plurality of parallel line segments 110. Line segments 110 may, for example, correspond to the desired output of a lithography process, such as for the formation of metal lines in a metal layer of a circuit structure. Generally, feature sizes on circuit structure layers, as well as the spacing or pitch between features, have been continually getting smaller as demand for more powerful and compact integrated circuits has increased. Some lithography processes and tools, however, may not be capable of printing features such small features and tight pitches in a single printing process, as the spacing between features may be too small for a lithography tool to accurately form. This may particularly be the case for lithography processes employing deep ultraviolet light, as deep ultraviolet light may have a wavelength greater than the size of features being formed on a circuit structure layer.

Figure 1B:
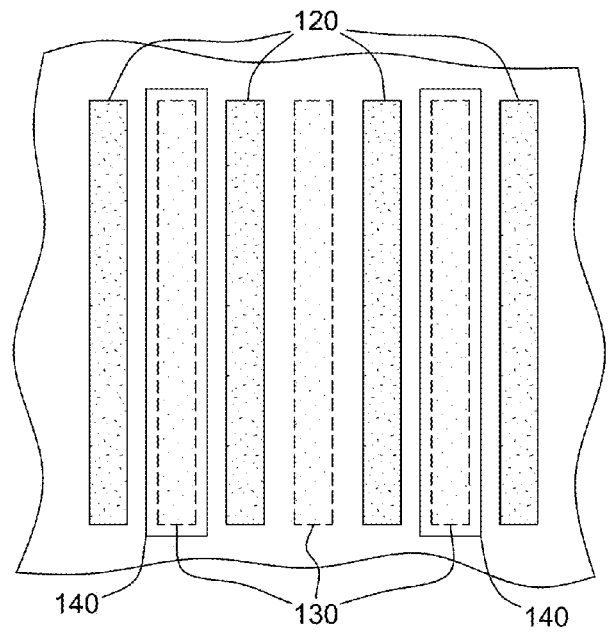

For such cases, a double-patterning process, such as a self-aligning double-patterning process, may be used to print a desired pattern. Double-patterning processes may be employed to form two similar sets of features side-by-side in a series of exposure processes. Ideally, existent lithography tools may be capable of accurately printing each separate exposure because the spacing between features in any one exposure is large enough that issues such as light diffraction and light interference may be minimized. By making two such exposures side-by-side, a double-patterning process may be able to double the number or density of features beyond what a lithography tool might otherwise be capable of printing accurately. FIG. 1B depicts an embodiment of several elements that may be incorporated in a double-patterning process and that may be used to print design 100 of FIG. 1A. In a self-aligned double-patterning process, the same reticle used in the formation one set of lines may also used in the formation of a second set of lines (as illustrated and detailed below in FIG. 1C and FIG. 1D). A first set of exposure lines, often named "mandrels" 120, may be exposed or formed first on a circuit structure layer through the use of a patterning reticle. A second set of exposure lines, often named "non-mandrels" 130, may then be exposed or formed by shifting the patterning reticle. To form patterns such as design 100 of FIG. 1A, in which some mandrel or non-mandrel lines are not to be formed, the first or second exposure (or both) may further employ a masking reticle. This masking reticle may contain a "blocking mask" pattern and may generally be referred to as a blocking mask or blocking mask reticle. A masking reticle may include one or more pattern blocks, represented in FIG. 1B by pattern blocks 140. The masking reticle may be overlaid with the double-exposure patterning reticle, such that certain portions of the patterning reticle that permit light to pass through are blocked by the masking reticle. Thus, in this example, pattern blocks 140 would prevent the exposure and formation of some of the non-mandrels 130 that would otherwise be printed in the absence of the masking reticle. It should be noted that the distinction between mandrel and non-mandrel lines may mainly be relevant to the double-patterning process. The final printing of such lines on a circuit structure layer, as for example with a metal layer, may involve filling both mandrels and non-mandrels with the same type of material to form the final circuit structure layer features. Lines formed as "mandrels" may then be indistinguishable from lines formed as "non-mandrels."

Figure 1C:
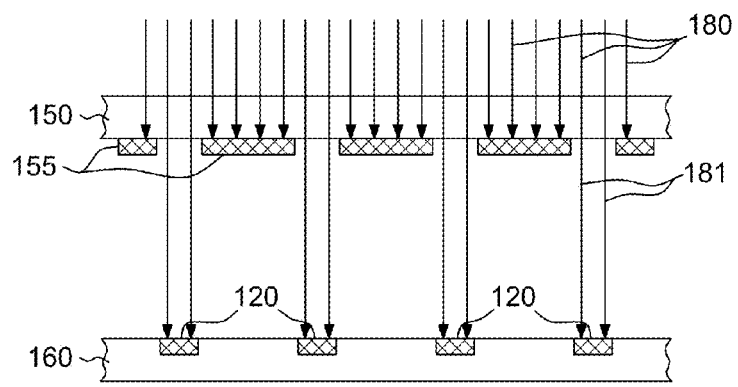
Figure 1D:
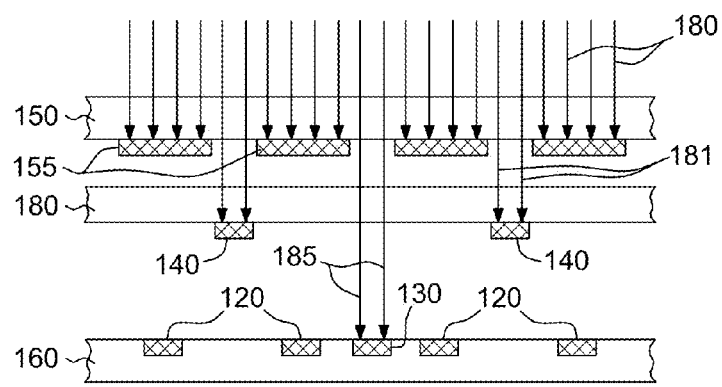

FIGS. 1C and 1D further illustrate an embodiment of a portion of a double-patterning process, as partially described with reference to FIG. 1B. FIG. 1C illustrates a first exposure step for double-patterning. A patterning reticle 150 including one or more light blocks 155 may be used to pattern a portion of a circuit structure layer 160. Ultraviolet light 180 may be transmitted through reticle 150; the light is stopped by the light blocks 155 but passes through reticle 150 where light blocks 155 are absent. The remaining ultraviolet light 181 transmitted exposes portions of circuit structure layer 160, forming mandrels 120. FIG. 1D then illustrates a second exposure step. Patterning reticle 150 here has been shifted to allow for exposure of additional portions of circuit structure layer 160. Masking reticle 180, which includes pattern blocks 140, is overlaid with patterning reticle 150 to block ultraviolet light 181 that passes through reticle 150. The transmitted light 185 that actually reaches circuit structure layer 160 forms non-mandrels 130. The pattern of mandrels 120 and non-mandrels 130 on the circuit structure layer, at least in this example, correspond to design 100 in FIG. 1A. It should be noted that FIGS. 1C and 1D illustrate only one possible embodiment of a double-patterning process, and that many different double-patterning processes, possibly involving the formation, exposure, or etching of multiple material layers, may achieve similar end results as those depicted in FIGS. 1A through 1D.

FIGS. 1B through 1D depict an ideal embodiment of double-patterning to print the design 100 of FIG. 1A, in which pattern blocks 140 function ideally without such effects as light diffraction or interference. In real practice, however, the pattern blocks actually formed on a masking reticle may have to be formed with larger dimensions than as designed. Larger dimensions for the pattern blocks may be necessary in order to compensate for physical defects that may occur in the material used to form these blocks on a masking reticle. For example, small notches of material may peel back, which may result in metal lines of the circuit structure layer similarly pulling back; in areas where the metal line is intended to contact a via of an underlying or overlying via layer, this pull back may prevent such contact and cause a circuit failure. Similarly, and particularly for pattern blocks in the shape of a many-sided polygon (e.g., more than 4 sides), inner-corners of the blocked area may be rounded out rather than conforming to a corner shape. This may result in creating small slivers of a layer that cannot be filled properly in subsequent processing stages, or may also cause metal lines to pull back and fail to make contact with intended vias in an adjacent via layer. Solving these problems has generally involved making pattern blocks on a masking reticle larger than a design absolutely requires. Thus, for example, the ideal pattern blocks 140 illustrated in FIG. 1B may, in actual use, need to be sized larger than illustrated in order to cover the areas depicted.

Figure 1E:
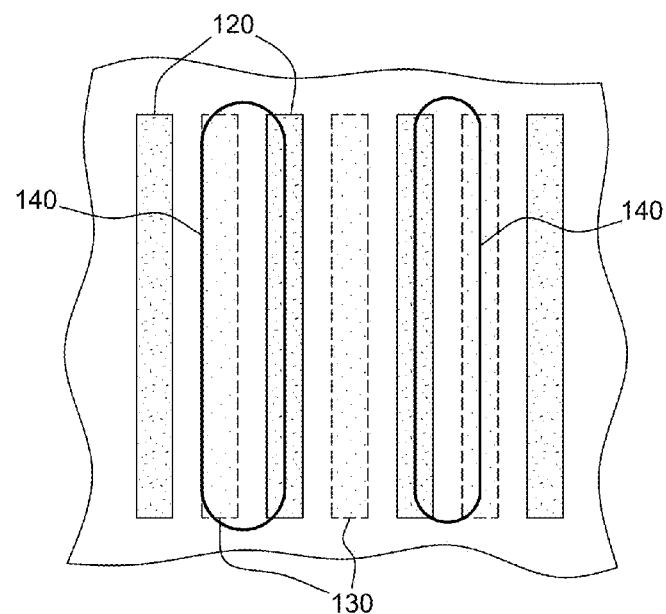
FIGS. 1E-1F illustrate an embodiment of a double-patterning process using a masking reticle, highlighting issues that may be caused by masking reticles with pattern blocks whose separation falls within a forbidden pitch range which are to be addressed by one or more aspects of the present invention.

However, making pattern blocks larger may lead to additional problems, and may particularly lead to forbidden pitch issues. A forbidden pitch, at least for a reticle, may be defined as a pitch or separation between two reticle features, such as pattern blocks for a masking reticle or patterning reticle, that may lead to degradation of structures or features to be formed on a circuit structure layer or printed wafer. Such degradation may be the result, for example, of light diffracting at the edge of a pattern block and undesirably interfering, either constructively or destructively, with light diffracting at an edge of another pattern block. Forbidden pitch ranges may be identified and defined for any given masking reticle via, for example, experimental or computer-run simulations of using the reticle in a particular lithography process. Some examples of the results of such forbidden pitch issues are illustrated by FIG. 1E. Here, pattern blocks 140, corresponding to the ideal pattern blocks depicted in FIG. 1B, do not precisely block the intended non-mandrel lines 130. Instead, pattern blocks 140 block a larger area than intended, and as a result of one or more light diffraction or interference effects, the covered areas may shift from their intended positions. As depicted, some portions of non-mandrel lines that should have been blocked by pattern blocks 140 may instead be exposed on the circuit structure layer, and some portions of mandrel lines that should be exposed may instead be blocked.

Figure 1F:
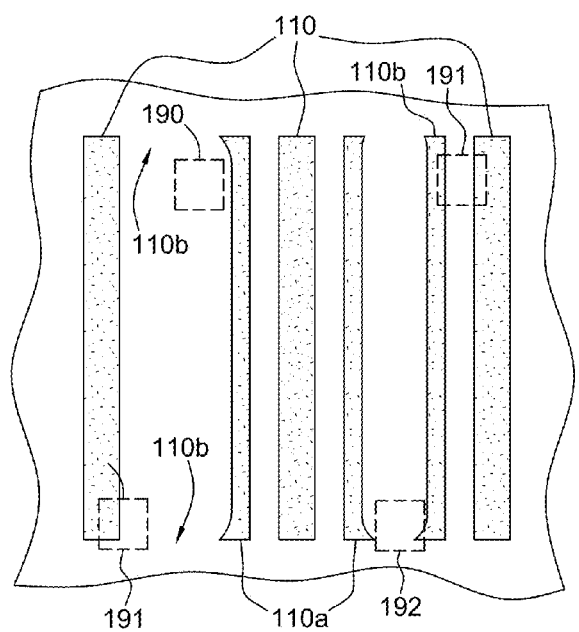

An embodiment of the end result of the above process is depicted in FIG. 1F. Some line segments 110 have been filled in properly as designed, according to the design 100 in FIG. 1A. However, some segments 110a have been improperly filled as a result of pattern block encroachment. Other segments and slivers 110b should not exist at all, according to the intended design of FIG. 1A. Some possible further results of these issues are illustrated by the underlying vias 190, 191, 192 in, for example, an underlying via layer. For example, via 190 lacks connection to any line segment. Vias 191 make contact with designed line segments 110, but also have contact with slivers or segments 110b that should not exist. And, for example, via 192 ought to have made contact with a nearby line segment that was not properly formed 110a, and instead has contact with a line segment 110b that should not have been formed at all, according to design. Such unintended contacts or lack of contacts between a metal layer and a via layer may cause one or more failures in a circuit structure.

Figure 2A:
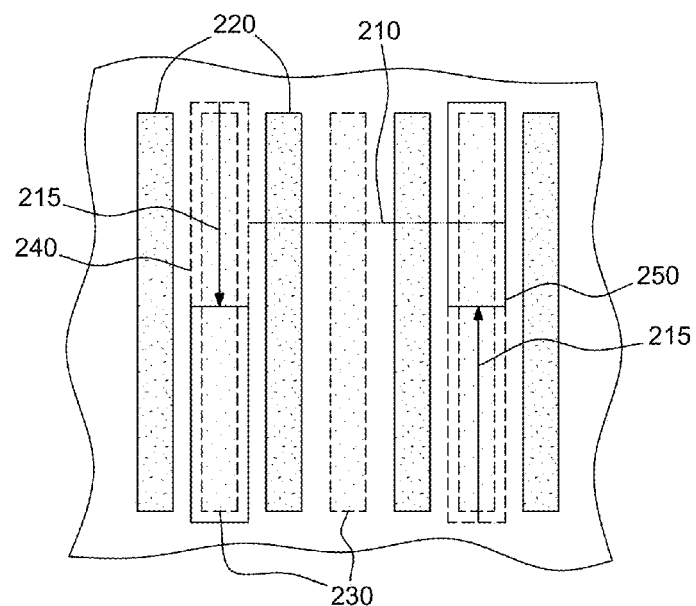
FIG. 2A depicts one embodiment of modifying a masking reticle to facilitate resolving forbidden pitch issues, according to one or more aspects of the present invention.

FIG. 2A depicts an exemplary embodiment of a method to resolve forbidden pitch issues, as demonstrated in the examples of FIGS. 1E and 1F. Mandrels 220 and non-mandrels 230 in FIG. 2A correspond to similar mandrels and non-mandrels of FIG. 1B. Pattern blocks 240 and 250, which initially include both the solid and dashed lined areas (corresponding to the pattern blocks 140 in FIG. 1B), are pattern blocks of a mask pattern on a masking reticle, and generally oriented in a direction of a length axis, which may correspond to the length axis of mandrels 220 and non-mandrels 230. Pattern blocks 240 and 250 are identified as a first pattern block 240 and a second pattern block 250 for which at least some portion of the first pattern block 240 and some portion of the second pattern block 250 are in parallel relation in the direction of the length axis. (Note that the terms "first pattern block" and "second pattern block" are interchangeable as between any two pattern blocks, thus pattern block 250 could as easily be termed the "first pattern block" without limitation.) This "parallel relation" may be found, in principle, by finding an imaginary line 210 running from one length edge of the first portion of the first pattern block 240 to the corresponding edge of the second portion of the second pattern block 250, where imaginary line 210 is perpendicular to the length edges. Imaginary line 210 also represents a transverse (i.e., perpendicular to the length axis) separation S between the length edge of the first portion of first pattern block 240 and the corresponding length edge of the second portion of second pattern block 250. When this transverse separation S falls within a pre-defined forbidden pitch range for the masking reticle, a length of the first portion of at least first pattern block 240 is reduced by a length $L_1$. This reduction in length of at least one pattern block may be accomplished, for example, via an optical proximity correction process. A similar optical proximity correction process may also be used to find and identify the first pattern block 240 and second pattern block 250. The reducing may also include reducing a length of the second portion of second pattern block 250 by a length $L_2$. This is depicted in the exemplary embodiment of FIG. 2A, in which both pattern blocks 240 and 250 are reduced in length, as depicted by arrows 215, such that only the solidly-bordered portions of pattern blocks 240 and 250 remain and the dash-bordered portions are removed via reduction of pattern blocks 240 and 250. Ideally, regardless of how much each of pattern blocks 240 and 250 are reduced in length, the reducing results in the first pattern block 240 and second block 250 no longer having first and second portions thereof in parallel relation in the direction of the length axis. This may be demonstrated in FIG. 2A, where the solid portions of pattern blocks 240 and 250 have no portions that are in parallel relation—that is, an imaginary perpendicular line drawn from an edge of one solid length edge of pattern block 240 would not reach a corresponding solid length edge of pattern block 250. This effectively removes forbidden pitch issues from the masking pattern, as now there are no longer any portions of pattern blocks 240 and 250 that are separated by a transverse separation that falls within a forbidden pitch range for the masking pattern. In practice, light interacting around pattern block 240 may not interfere with light interacting around pattern block 250, ideally resulting in reduced or no encroachment of blocking areas on lines that should be printed, and ideally resulting in no slivers of unwanted lines being printed on a circuit structure layer.

Figure 2B:
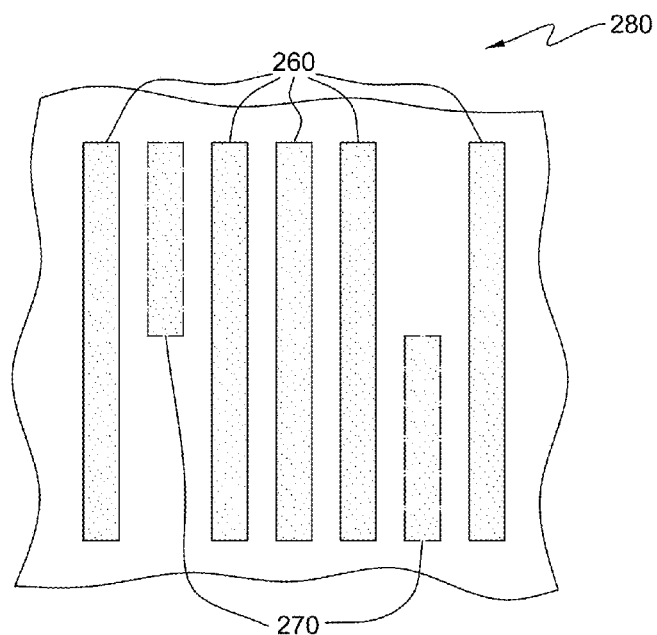
FIG. 2B illustrates one embodiment of a circuit structure layer that may result from the use of a masking reticle modified by the approach of FIG. 2A, including one or more "dummy line segments" being added to the circuit structure layer, according to one or more aspects of the present invention.

FIG. 2B depicts an embodiment of a printed result from using the modified pattern blocks of FIG. 2A, as may result when using the modified mask pattern of FIG. 2A in a double-patterning lithography process. Printed design 280 largely corresponds to design 100 depicted in FIG. 1A, with designed line segments 260 properly formed. Because portions of pattern blocks were removed, as illustrated in FIG. 2A, two additional "dummy line segments" 270 have also been printed, in those areas of FIG. 2A that were no longer covered by a portion of a pattern block as a result of reducing the lengths of the pattern blocks on the masking reticle. These dummy line segments 270 may generally be formed of the same material as designed line segments 260, as they may be formed in the same step as designed line segments 260. However, dummy line segments 270 may not be active lines, as opposed to designed line segments 260 which may be active line segments. Whereas active line segments may generally be designed to make contact with one or more components of another circuit structure layer, such as metal line segments making contact with vias in an adjacent via layer, inactive segments may be formed so that they do not make contact with any components of another circuit structure layer. Thus, the reduction of one pattern block or multiple pattern blocks, as described above in FIG. 2A, may also require a determination of which portions of one or both pattern blocks may be reduced so as to form dummy lines that will not make contact with other circuit structure layers.

Figure 2C:
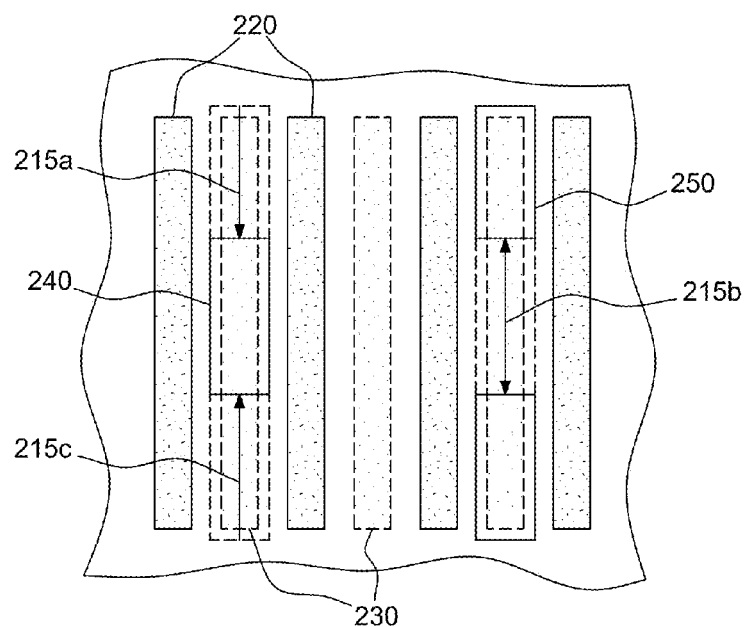
FIG. 2C depicts one alternate embodiment of modifying a masking reticle to facilitate resolving forbidden pitch issues, according to one or more aspects of the present invention.

FIG. 2C illustrates an alternate exemplary embodiment of the method depicted in FIG. 2C. In this example, first pattern block 240 and second pattern block 250 on a masking reticle are again in parallel relation in the direction of the length axis, and both have again been identified as having a transverse separation S that falls within a forbidden pitch range identified for the masking reticle. Here, second pattern block 250 is reduced by a length L2, represented by double-arrow 215b, where the reduction is performed on a middle section of second pattern block 250 (depicted again by the dash-bordered portion of second pattern block 250), rather than performing the reduction on one end of second pattern block 250. This may be necessary, for example, where the two solid-bordered ends of second pattern block 250 are essential in order to prevent the formation of metal lines that would otherwise make contact with, for instance, a via layer; the dashed portion of second pattern block 250, however, may not be essential, as there may be no underlying feature in another circuit structure layer in that area. Corresponding to this reduction in second pattern block 250, first pattern block 240 is reduced on one end, represented by arrow 215a, and reduced on the other end as well, represented by arrow 215c. The lengths corresponding to arrows 215a, 215c may be the same or may be different lengths, according to the requirements of the circuit structure layer.

Figure 2D:
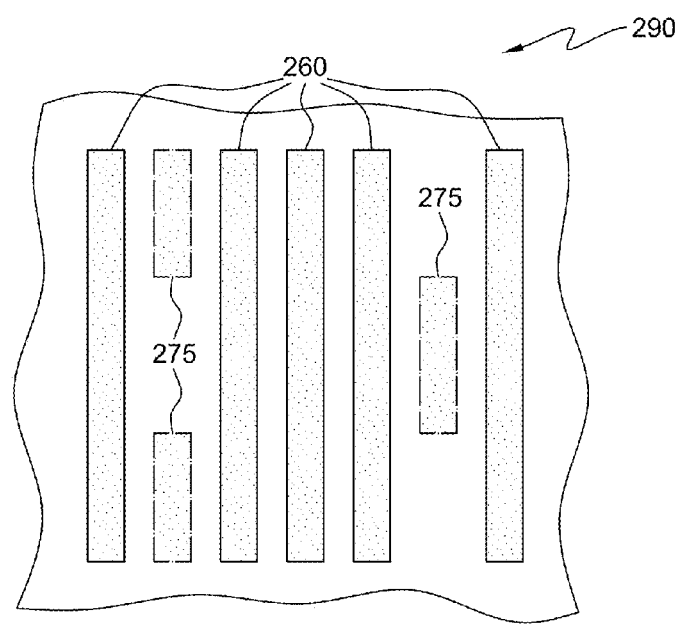
FIG. 2D illustrates one embodiment of a circuit structure layer that may result from the use of a masking reticle modified by the approach of FIG. 2C, according to one or more aspects of the present invention.

FIG. 2D depicts an embodiment of the printed result from using the modified mask pattern of FIG. 2C. Similar to FIG. 2B, printed design 290 corresponds largely to design 100 of FIG. 1A, with designed line segments 260 properly formed. Dummy line segments 275 have also been printed. As with printed design 280 of FIG. 2B, dummy line segments 275 may ideally be inactive line segments that do not make contact with any features of another circuit structure layer.

Figure 3A:
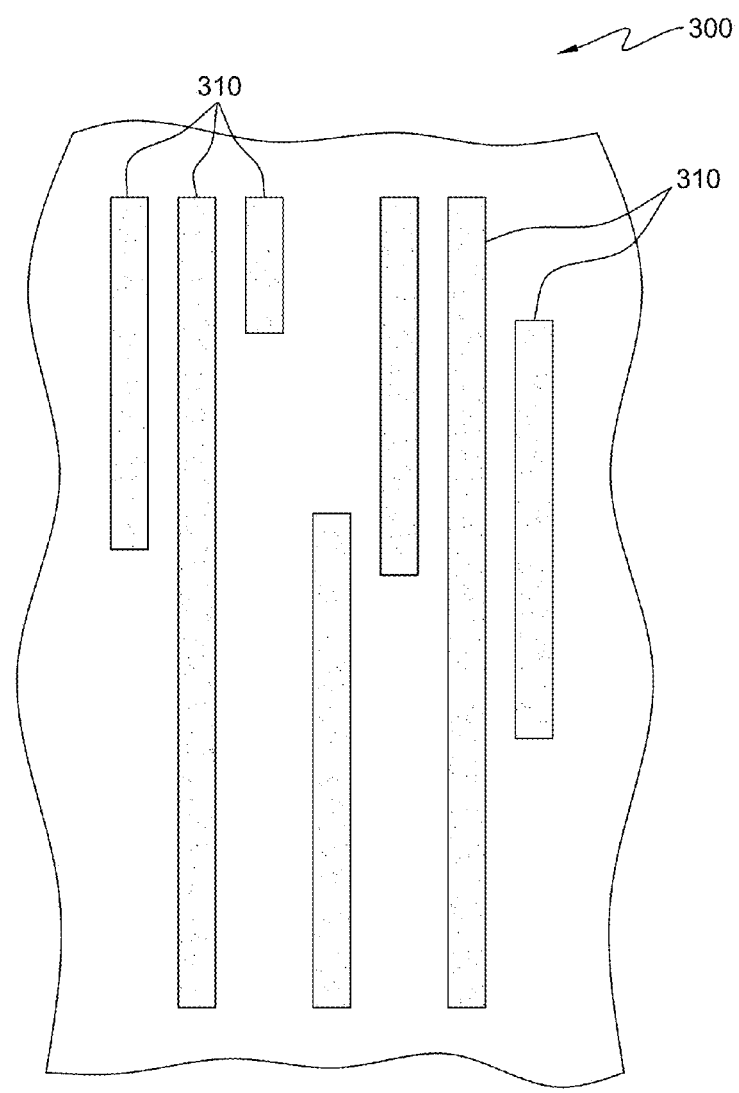
FIG. 3A depicts one embodiment of a portion of a circuit structure layer design, according to one or more aspects of the present invention.

FIG. 3A depicts an embodiment of another circuit structure design 300 including a plurality of designed line segments 310. Circuit structure layers formed by a double patterning process may have many designed line segments, as does the design 300 depicted here, the proper formation of which may require a masking reticle that includes more than two pattern blocks. The method depicted in the above embodiments may also be applied to such masking reticles, and may be used to correct forbidden pitch concerns throughout the masking patterns on such masking reticles, as further described below and in FIGS. 3B through 3G.

Figure 3B:
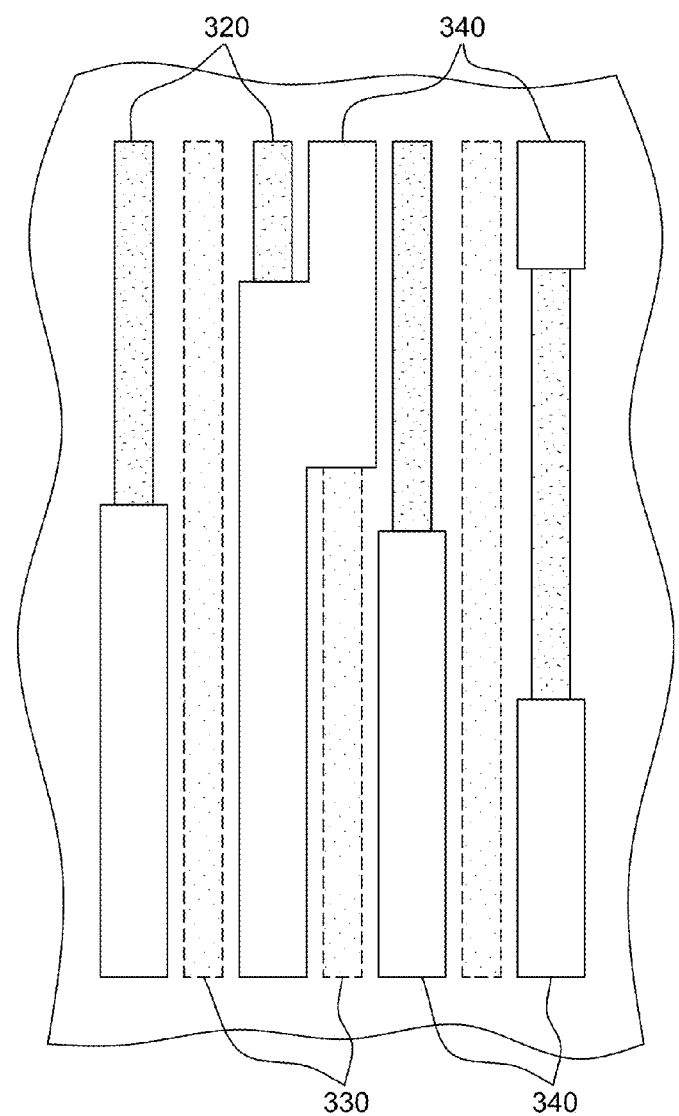
FIG. 3B illustrates one embodiment of at least a portion of elements that may be used to print the circuit structure layer design of FIG. 3A, according to one or more aspects of the present invention.

FIG. 3B depicts an embodiment of a portion of elements that would ideally print the design 300 in FIG. 3A. A double-patterning process may form mandrels 320 and non-mandrels 340. Pattern blocks 340, corresponding to pattern blocks on a masking reticle, may be used to prevent exposure of a portion of both mandrels 320 and non-mandrels 330, according to design 300 depicted in FIG. 3A. It may thus be noted that the same masking reticle may possibly be overlaid with a patterning reticle for both a first exposure step and a second exposure step in a double-patterning process.

Figure 3C:
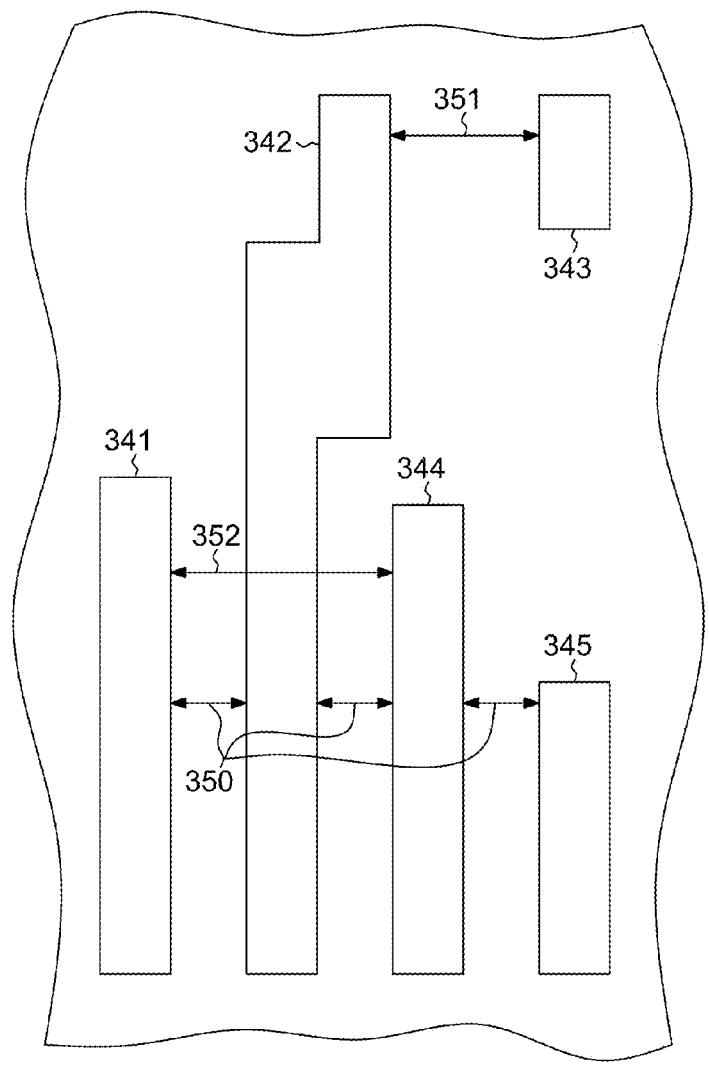
FIG. 3C depicts one embodiment of a portion of a masking pattern on a masking reticle, illustrating in part an approach for identifying pairs of pattern blocks of the masking pattern and measuring a transverse separation between pattern blocks, according to one or more aspects of the present invention.
Figure 3D:
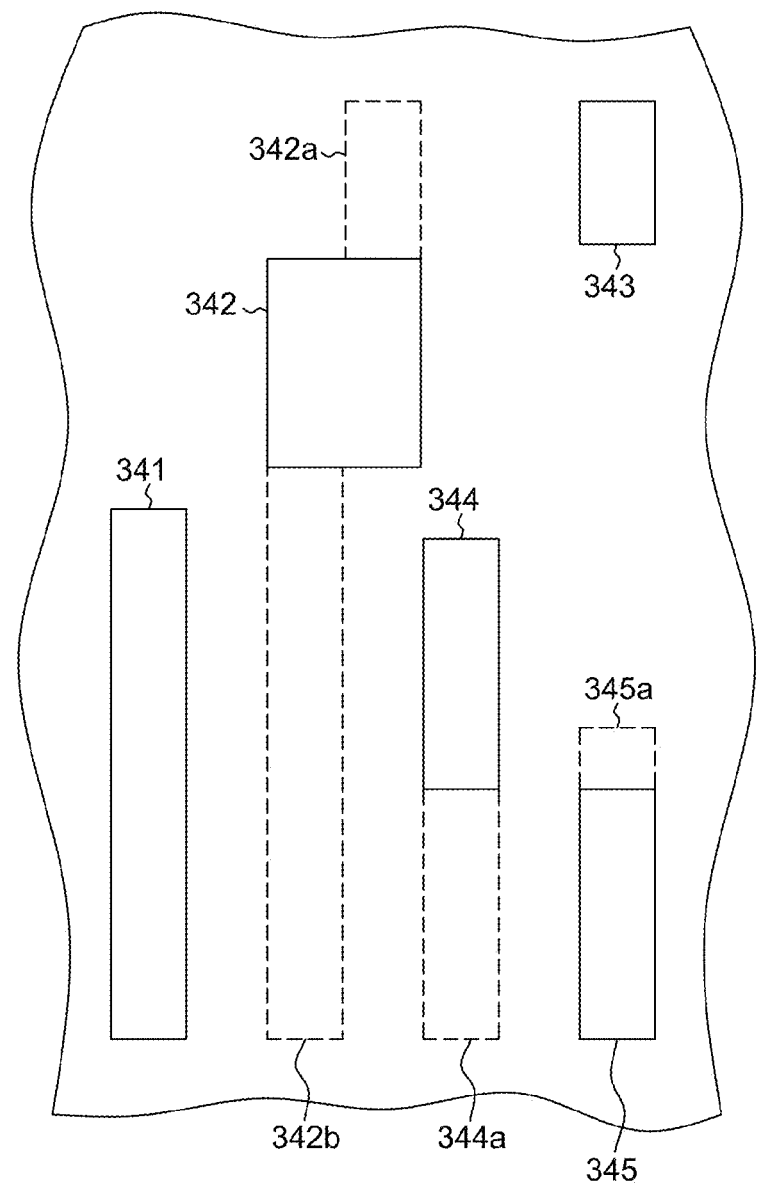
FIG. 3D depicts one example embodiment of an approach for modifying a portion of the masking pattern of FIG. 3C, including reducing lengths of one or more portions of pattern blocks of the masking pattern when the transverse separation between two pattern blocks falls within a forbidden pitch range, according to one or more aspects of the present invention.

FIG. 3C depicts the pattern blocks of FIG. 3D, as they may appear as part of a masking pattern on a masking reticle, without depicting any underlying mandrel and non-mandrel lines in order to clearly illustrate identification of pattern blocks with portions in parallel relation that may need to be modified. For example, pattern block 341 is in parallel relation in the direction of the length axis with at least a portion of pattern block 342, pattern block 344, and pattern block 345. Pattern block 341 and pattern block 342, for the respective portions that are in parallel relation, share a transverse separation 350 that falls within a pre-defined forbidden pitch range. Similarly, a portion of pattern block 342 is in parallel relation with pattern block 344, and pattern block 345 is in parallel relation with a portion of pattern block 344. In each case, the relevant pair of pattern blocks are separated by a transverse separation 350 that falls within the forbidden pitch range. As well, another portion of pattern 342 is in parallel relation with pattern block 343, and the pattern block portions are separated by a different transverse separation 351 that nonetheless still falls within a forbidden pitch range. However, pattern block 341 and pattern 344, although in parallel relation, share a transverse separation 352 that falls outside the pre-defined forbidden pitch range. Thus, these block portions need not be modified in relation to each other, although pattern block 341 and pattern block 344 may need to be modified in relation to pattern block 342.

FIG. 3D illustrates an exemplary embodiment of one possible choice of pattern block reductions that might be applied to the pattern blocks depicted in FIG. 3C; it may be realized that there might be many alternative choices of pattern block reductions, depending on the particular layers being formed. Here, pattern blocks 342, 344, and 345 are modified to remove forbidden pitch regions, while pattern blocks 341 and 343 remain unmodified. The portion 342a of pattern block 342 that was in parallel relation with pattern block 343 may be reduced in length, as well as the other portion 342b of pattern block 342 that was in parallel relation with both pattern blocks 341 and 344. Similarly, a portion 344a of pattern block 344 and another portion 345a of pattern block 345 are reduced. As noted above with other embodiments of the disclosed method, the choices of which pattern block portions may be reduced, and which portions of pattern blocks should remain, may in part be dictated by other circuit structure layers near or adjacent to the circuit structure layer to be formed, as dummy line segments generally may not be formed in regions where such dummy line segments would come in contact with another circuit structure, rendering such dummy line segments active rather than inactive.

Figure 3E:
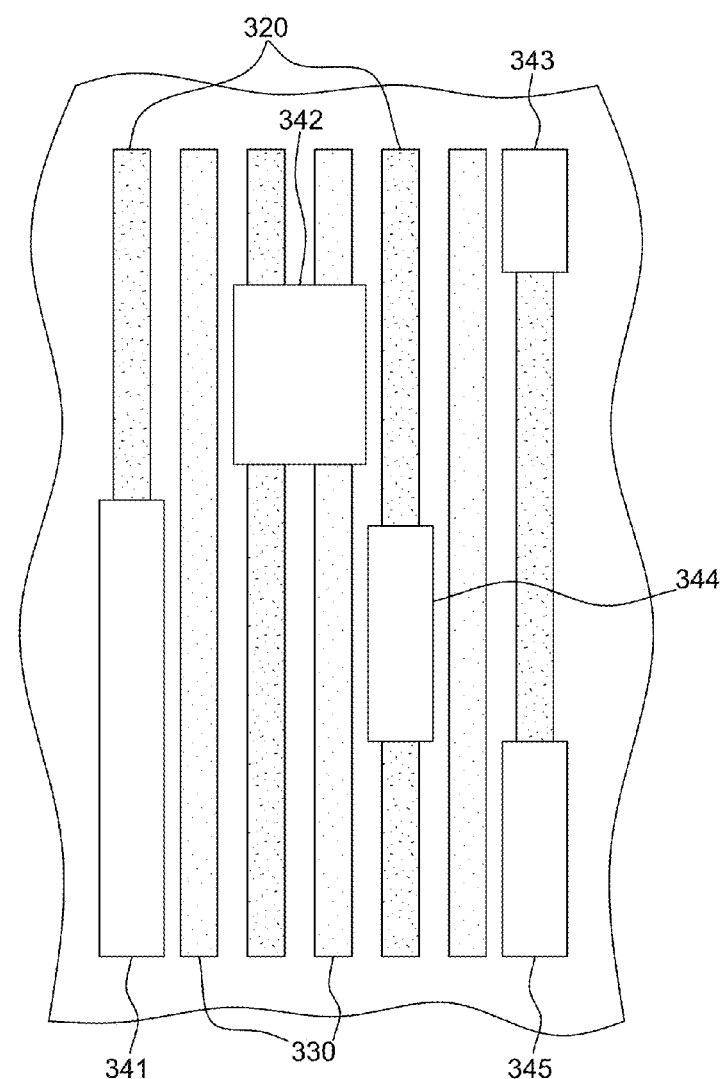
FIG. 3E illustrates one embodiment of at least a portion of elements that may be used to print a modified circuit structure layer design, using a modified masking pattern of FIG. 3D, according to one or more aspects of the present invention.

FIG. 3E illustrates the embodiment of pattern block reductions depicted in FIG. 3D, with underlying mandrels 320 and non-mandrels 330 included again to partially illustrate the effect of modifying pattern blocks 342 and 344. In this exemplary embodiment, pattern blocks 341 and 342 no longer have any portions that are in parallel relation with each other. Similarly, pattern block 342 no longer has any portion in parallel relation with pattern blocks 343 or 344, and pattern block 344 is no longer in parallel relation with pattern block 345 for any portion. It is permissible for pattern block 341 to retain its portion that remains in parallel relationship with pattern block 344 (and by extension pattern block 345) because the transverse separation between pattern block 344 and 341 falls outside a forbidden pitch range for the masking reticle.

Figure 3F:
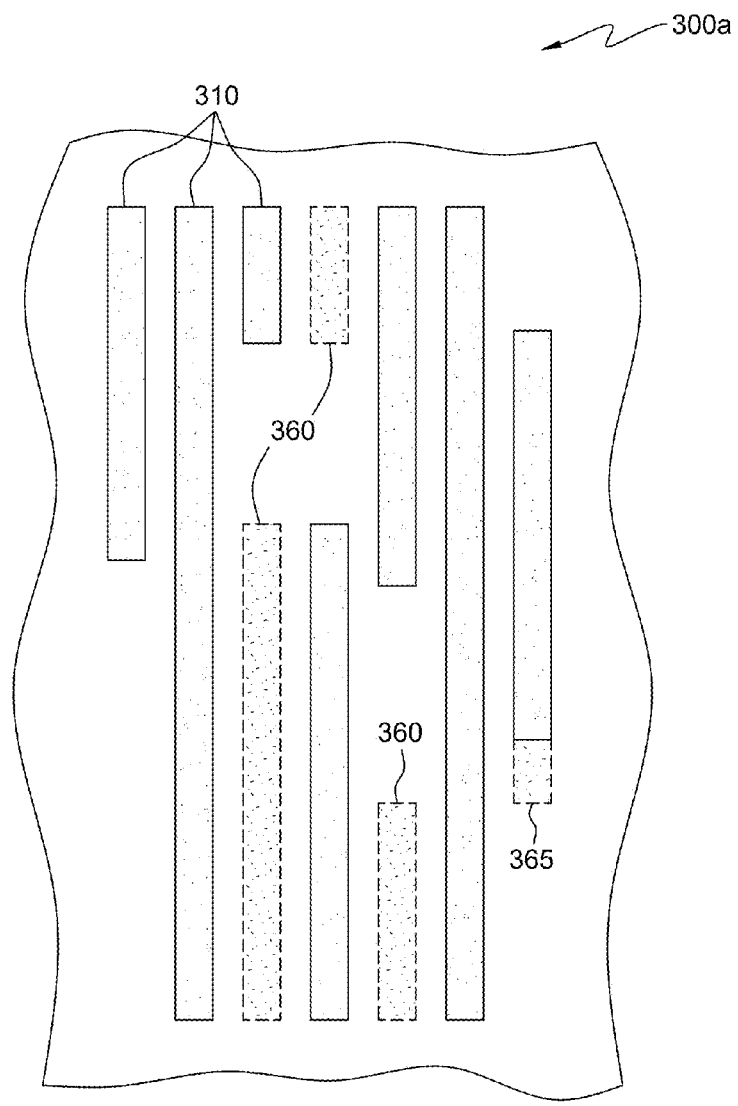
FIG. 3F illustrates one embodiment of the portion of the circuit structure layer design of FIG. 3A as modified by the modified masking pattern of FIGS. 3D and 3E, according to one or more aspects of the present invention.

FIG. 3F further illustrates the effects of modifying pattern blocks, as described in FIGS. 3D and 3E, in relation to the original design 300 of the circuit structure layer depicted in FIG. 3A. The modified mask pattern, when applied in a lithographic process, may result in modified design 300a of the circuit structure layer. Original line segments 310 remain as designed, with additional dummy line segments 360 added to the modified design 300a, corresponding to portions of pattern blocks on the masking reticle that were removed in FIGS. 3D and 3E. As well, at least one dummy line segment "extension" 365 has also been added to existing designed line 310a. Dummy line segment extensions that extend and make contact with an existing designed line may be one result of modifying a mask pattern in accordance with the disclosed methods. Although these dummy line segment extensions may be in contact with designed line segments, like dummy line segments 360 that are isolated from other lines, they ideally may not make contact with any other circuit structure layer.

Figure 3G:
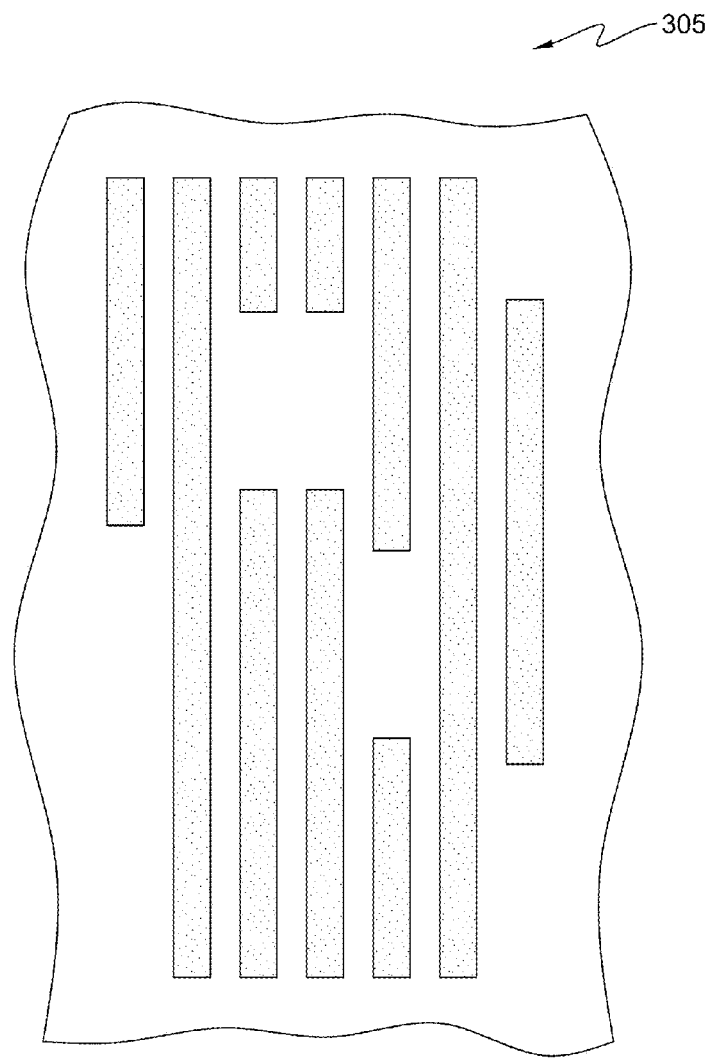
FIG. 3G depicts one embodiment of a portion of a printed circuit structure layer that may result from using the modified circuit structure layer design of FIG. 3F, according to one or more aspects of the present invention.

FIG. 3G depicts an embodiment of the circuit structure 305 resulting from modified design 301 of FIG. 3F. A final circuit structure layer output by a double-patterning process may be a plurality of line segments 380 that may be made of the same material. This may be the case, for example, when the circuit structure layer is a metal layer, including a plurality of metal line segments, in which each metal line is made of the same type of metal. In one example, metal lines may be formed by filling mandrel and non-mandrel lines exposed in a layer by a double-patterning process. Thus, the final circuit structure layer may not distinguish between designed line segments and dummy line segments or dummy line segment extensions, as illustrated in FIG. 3G. Although dummy line segments and extensions may be inactive, in that they may not make contact with other circuit structure layers, they may still introduce some amount of parasitic capacitance within the circuit structure layer. This may be the case when the lines are metal lines, and active lines carry some amount of electric current within the layer. Inactive metal line segments formed between two active metal line segments may build up some level of capacitance in response to electric charge being carried by the active metal lines. Such "parasitic" capacitance may need to be accounted for in the final modified design of a circuit structure layer. It may thus be useful to refer to a model or plan of circuit structure 305, as it may finally be formed in a circuit structure layer, to calculate capacitances between the plurality of lines 380 formed in the circuit structure layer. In some instances, calculations of such parasitic capacitances may reveal one or more areas of capacitance that exceed a pre-defined capacitance limit for the circuit structure layer, and this may require further modification of pattern blocks on a masking reticle to not only remove forbidden pitch regions but also to prevent unacceptable parasitic capacitance within the resulting circuit structure.

Figure 4A:
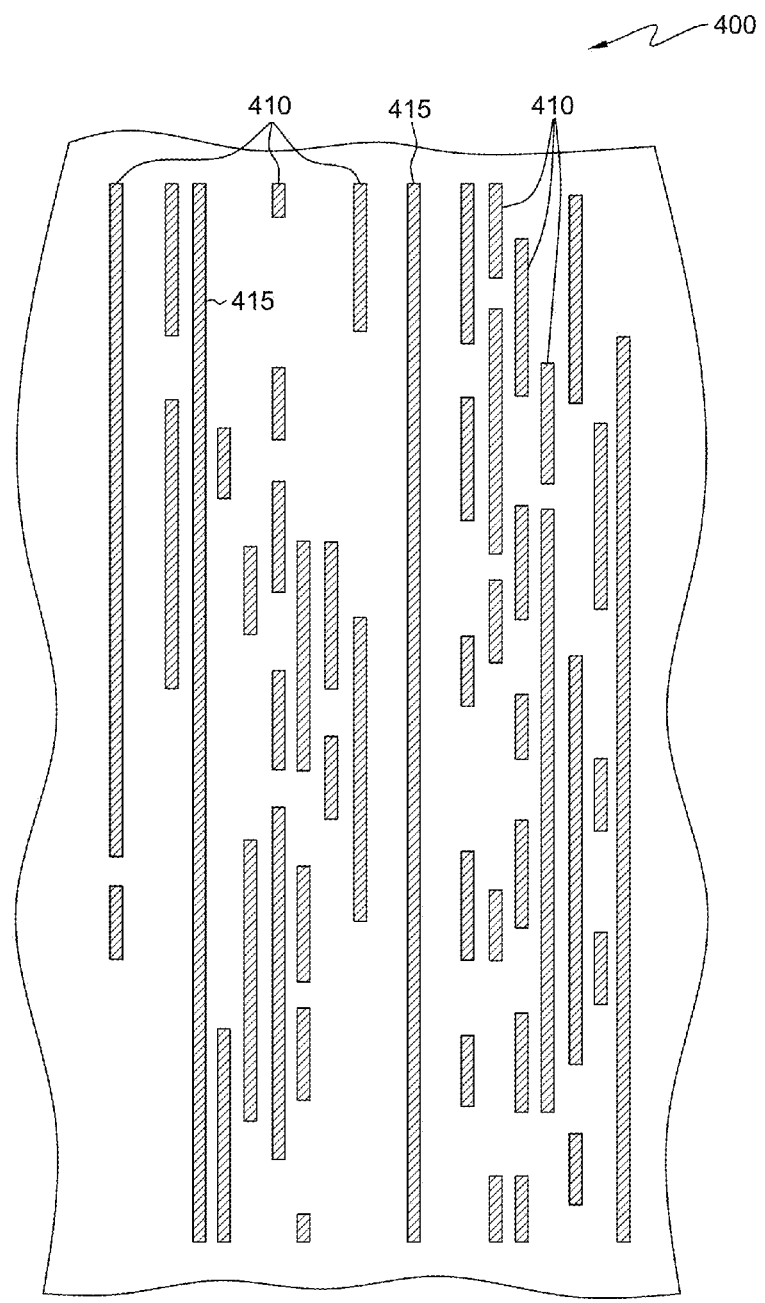
FIG. 4A depicts another embodiment of a portion of a circuit structure layer design, further illustrating problems that may result from the use of unmodified masking reticles with forbidden pitch issues, according to one or more aspects of the present invention; and, FIG. 4B depicts the portion of the circuit structure layer design of FIG. 4A, as may be modified by one or more of the masking pattern modification approaches disclosed herein, according to one or more aspects of the present invention.
Figure 4B:
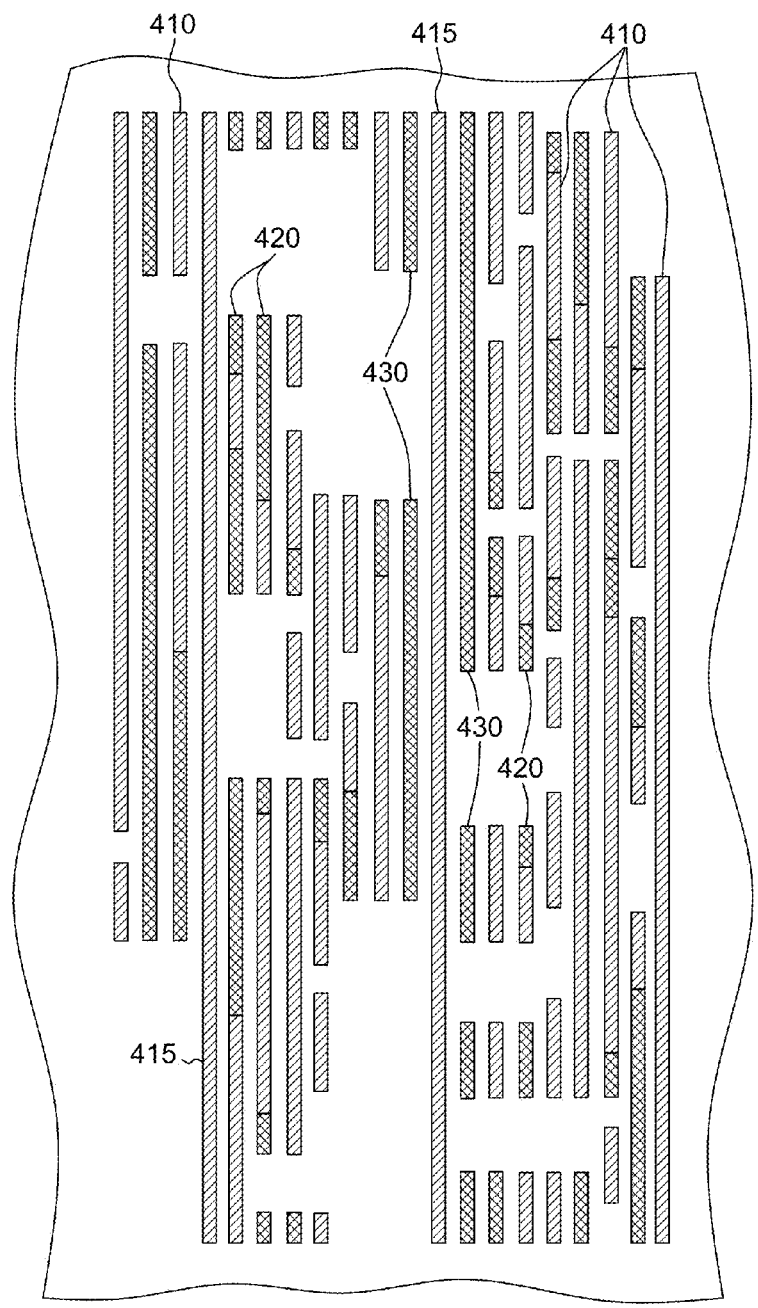

FIGS. 4A and 4B illustrate another embodiment of a portion of the methods described herein, by way of further illustrating problems with double-patterning lithography that may be solved by the methods disclosed herein. FIG. 4A depicts an embodiment of a portion of a design 400 for a circuit structure layer, which may be a metal layer, that may be formed by a double-patterning process. The forming of such a design on a printed circuit structure layer may require a complex mask pattern on a masking reticle, and such a complex mask pattern may include numerous forbidden pitch regions between any two blocking mask pattern blocks. In such an example, use of an unmodified mask reticle in conjunction with the double-patterning lithography process may not only encroach on metal line segments 410, but may also encroach on main current lines 411. While shorted metal line segments 410 may result in poor or non-existent contact with an underlying via in a via layer, causing some problems for the circuit structure layer, a shorted main current line 411 may result in complete failure of the circuit structure layer.

FIG. 4B depicts design 400 of FIG. 4A, modified according to one or more embodiments described above, resulting in modified design 405. Here, the method described above in FIGS. 2A and 2B, as well as other figures, may be applied repeatedly to identify pairs of pattern blocks throughout a masking reticle to locate pairs of pattern blocks that have some portion thereof that are in parallel relation in the direction of the length axis and that are separated by a transverse span that falls within the forbidden pitch range for the mask reticle. The result may be the modified design 405 depicted here, including designed line segments 410 and lines 411, as well as dummy line segments 430 and dummy line segment extensions 420.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
   obtaining a masking reticle comprising a mask pattern, the mask pattern comprising a plurality of pattern blocks, the pattern blocks oriented in a direction of a length axis;
   modifying the mask pattern to obtain a modified mask pattern by:
   identifying a first pattern block and a second pattern block of the plurality of pattern blocks where at least a first portion of the first pattern block and a second portion of the second pattern block are in parallel relation in the direction of the length axis; and
   reducing a length of the first portion of the first pattern block by a length $L_1$ when a transverse separation S between a length edge of the first portion of the first pattern block and a corresponding length edge of the second portion of the second pattern block falls within a pre-defined forbidden pitch range for the masking reticle.

2. The method of claim 1, wherein the reducing results in the first pattern block and the second pattern block no longer having first and second portions thereof in parallel relation in the direction of the length axis.

3. The method of claim 1, wherein modifying the mask pattern further comprises repeating the identifying and the reducing for multiple pairs of pattern blocks of the plurality of pattern blocks.

4. The method of claim 3, wherein the modified mask pattern lacks any pair of pattern blocks of the plurality of pattern blocks with a transverse separation S between a length edge of one pattern block and a corresponding length edge of another pattern block falling within the pre-defined forbidden pitch range for the masking reticle.

5. The method of claim 1, wherein the reducing the length of the first portion of the first pattern block removes the first portion of the first pattern block from the modified mask pattern.

6. The method of claim 1, wherein the reducing further comprises reducing a length of the second portion of the second pattern block by a length L2, wherein reducing the first portion of the first pattern block by length L1 and reducing the second portion of the second pattern block by length L2 results in the first pattern block and the second pattern block no longer having portions thereof in parallel relation in the direction of the length axis.

7. The method of claim 1, wherein the mask pattern is a blocking mask pattern.

8. The method of claim 1, wherein the identifying the first pattern block and the second pattern block comprises using an optical proximity correction process to identify the first pattern block and the second pattern block.

9. The method of claim 1, wherein the reducing the length of the first portion of the first pattern block by the length L1 comprises reducing the first portion of the first pattern block via an optical proximity correction process.

10. The method of claim 1, further comprising providing a design of a circuit structure layer, and wherein modifying the mask pattern results in modifying the design of the circuit structure layer to obtain a modified design of the circuit structure layer.

11. The method of claim 10, wherein the circuit structure layer is a metal layer.

12. The method of claim 10, wherein the design of the circuit structure layer comprises a plurality of parallel designed line segments.

13. The method of claim 12, wherein modifying the design of the circuit structure layer comprises adding at least one dummy line segment to the design of the circuit structure layer, the dummy line segment being parallel to and separate from the plurality of designed line segments.

14. The method of claim 12, wherein modifying the design of the circuit structure layer comprises extending a designed line segment of the plurality of parallel designed line segments with a dummy line extension, the dummy line extension being in contact with the designed line segment.

15. The method of claim 10, further comprising applying the modified mask pattern to a lithographic process, the lithographic process facilitating, at least in part, providing a circuit structure design reticle.

16. The method of claim 15, wherein the lithographic process comprises a double-patterning process.

17. The method of claim 16, wherein the double-patterning process is a self-aligning double-patterning process.

18. The method of claim 15, wherein applying the modified mask pattern to the lithographic process comprises overlaying the masking reticle comprising the modified mask pattern with the circuit structure design reticle.

19. The method of claim 18, wherein applying the modified mask pattern to the lithographic process results in obtaining a printed circuit structure layer comprising a plurality of active line segments and at least one inactive line segment.

20. The method of claim 19, wherein the circuit structure layer is one circuit structure layer of a plurality of circuit structure layers, and the at least one inactive line segment lacks electrical connectivity to the others of the plurality of circuit structure layers.

* * * * *